(12) United States Patent
Verhaverbeke

(10) Patent No.: US 7,314,854 B2
(45) Date of Patent: Jan. 1, 2008

(54) AMMONIUM HYDROXIDE TREATMENTS FOR SEMICONDUCTOR SUBSTRATES

(75) Inventor: Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/725,126

(22) Filed: Mar. 15, 2007

(65) Prior Publication Data
US 2007/0183956 A1    Aug. 9, 2007

Related U.S. Application Data

(62) Division of application No. 10/958,126, filed on Oct. 4, 2004, now Pat. No. 7,232,759.

(51) Int. Cl.
*C11D 7/32* (2006.01)
(52) U.S. Cl. ...................................... 510/175
(58) Field of Classification Search ................. 510/175
See application file for complete search history.

(56) References Cited

U.S. PATENT DOCUMENTS

| 6,448,622 | B1 | 9/2002 | Franke et al. |
| 6,713,326 | B2 | 3/2004 | Cheng et al. |
| 2002/0102852 | A1* | 8/2002 | Verhaverbeke et al. ..... 438/690 |
| 2004/0159335 | A1* | 8/2004 | Montierth et al. ............ 134/10 |
| 2006/0054181 | A1* | 3/2006 | Rayandayan et al. .......... 134/1 |

* cited by examiner

Primary Examiner—Mark Eashoo
Assistant Examiner—Asdjodi M. Reza
(74) Attorney, Agent, or Firm—Blakely Sokoloff Taylor & Zafman

(57) ABSTRACT

Embodiments of the current invention describe ammonia hydroxide treatments for surfaces. In one embodiment, a method and a cleaning solution including ammonium hydroxide ($NH_4OH$), water ($H_2O$), a chelating agent, and a surfactant for cleaning silicon germanium substrates are described. The cleaning solution does not include hydrogen peroxide ($H_2O_2$) because hydrogen peroxide etches germanium. In another embodiment, a method of terminating oxidized surfaces on semiconductor substrates with terminating groups that promote the bonding of the oxidized surface to another surface with a surface treatment containing ammonium hydroxide ($NH_4OH$) is described. The oxidized surface is immediately bonded to a second substrate after evaporation of the surface treatment.

12 Claims, 7 Drawing Sheets

AMMONIUM HYDROXIDE TREATMENTS FOR SEMICONDUCTOR SUBSTRATES

CROSS-REFERENCE TO RELATED APPLICATIONS

This application is a division of U.S. patent application Ser. No. 10/958,126 filed Oct. 4, 2004, now U.S. Pat. No. 7,232,759.

BACKGROUND OF THE INVENTION

1. Field of the Invention

The present invention relates to the field of cleaning and conditioning semiconductor substrates, and in particular to the field of cleaning a silicon germanium substrate and preparing a silicon dioxide surface for bonding.

2. Discussion of Related Art

Silicon germanium substrates may be used as the semiconductor material used to form the transistors of integrated circuits. Silicon germanium substrates may be used because they have higher electron mobility than silicon substrates. Although silicon germanium substrates may serve the same function as silicon substrates, silicon germanium substrates have different properties than silicon substrates and in some instances may require different processing than silicon substrates. This is true in the area of cleaning silicon germanium substrates prior to fabricating an integrated circuit.

Silicon substrates are typically cleaned using an SC1 (Standard Clean 1) solution containing ammonium hydroxide ($NH_4OH$), hydrogen peroxide ($H_2O_2$), and water. The SC1 solution cannot be used to clean silicon germanium substrates because hydrogen peroxide etches germanium and ammonium hydroxide etches silicon. SC1 prevents the etching of a silicon substrate by the formation of a protective oxide on the surface of the silicon substrate that passivates the silicon substrate. A high dilution of the SC1 solution or applying the SC1 solution to a silicon germanium substrate for a short period of time does not sufficiently prevent the etching of germanium by hydrogen peroxide because germanium is extremely sensitive to being etched by hydrogen peroxide. Additionally, because SC1 etches silicon germanium substrates, the SC1 solution causes significant roughness on the surface of the silicon germanium substrates. This roughness detrimentally affects the electrical properties of structures formed on the silicon germanium substrates. In the past, silicon germanium substrates have been cleaned by a hydrofluoric acid solution followed by a rinse by ozonated deionized water. But, this cleaning sequence causes significant etching and roughness of the surface of the silicon germanium substrates.

Cleaning and conditioning an oxidized surface on a semiconductor substrate in preparation for bonding to another surface to create the most effective bonding possible is also a challenge. For example, silicon dioxide surfaces on silicon substrates are typically bound to one another by placing two flat silicon dioxide surfaces into contact with one another. The two silicon dioxide surfaces are attracted to one another through Van der Waals forces and the surfaces will stick to one another. The silicon dioxide surfaces of the silicon substrates are then annealed to form covalent bonds between the two silicon dioxide surfaces at a high temperature in the range of 1000° C.-1100° C. Ideally, a silicon dioxide surface prepared for bonding to another silicon dioxide surface should be terminated with groups that promote easy bonding between two surfaces at a low temperature anneal to prevent damaging the substrate or structures, such as microelectronic machines (MEM's), formed on the substrates. Termination groups that promote easy bonding between two silicon dioxide surfaces include —OH, —$NH_4$, and —$O^-$. The typical cleaning processes used to clean a wafer before bonding include a final water rinse that converts these termination groups to oxygen bridges (—O—) between the silicon atoms of the silicon dioxide surface. Forming covalent bonds between two silicon dioxide surfaces terminated with oxygen bridges requires the high annealing temperatures in the range of 1000° C.-1100° C. But, eliminating the final water rinse after cleaning the substrate with well known cleaning solutions such as standard clean 1 (SC1) or standard clean 2 (SC2), which includes hydrochloric acid, hydrogen peroxide and water, would result in residues left on the wafer that would create particle defects between the two wafers that prevent the substrates from properly bonding and may adversely affect device performance. One prior art solution to eliminate the oxygen bridge termination groups is to treat the silicon dioxide surfaces, after having been cleaned and rinsed with water, with an oxygen plasma in order to break the oxygen bridges and create —$O^-$ terminating groups. But, the oxygen plasma treatment requires that the substrate be placed into an additional chamber and only serves to make the surface of the silicon dioxide surface reactive. The oxygen plasma does not clean the surface of the wafer and is thus an additional step that needs to be added to processing after wet cleaning the wafer.

SUMMARY OF THE INVENTION

Embodiments of the current invention describe ammonia hydroxide treatments for surfaces including silicon germanium substrates and silicon dioxide surfaces on semiconductor substrates.

In one embodiment a cleaning solution and a method for cleaning silicon germanium substrates is described. The cleaning solution includes ammonium hydroxide ($NH_4OH$), water ($H_2O$), a chelating agent, and a surfactant. The cleaning solution does not include hydrogen peroxide ($H_2O_2$) because hydrogen peroxide etches germanium. The surfactant within the cleaning solution may prevent the etching of the silicon within the silicon germanium substrate by coating the surface of the substrate. The cleaning solution may be applied to the silicon germanium substrate for a short period of time and at a low temperature to further prevent the etching of the silicon within the silicon germanium substrate. The application of acoustic energy to the silicon germanium substrate during cleaning may further decrease the period of time that the cleaning solution is applied to the silicon germanium substrate.

In another embodiment, a method of terminating oxidized surfaces on semiconductor substrates with terminating groups that promote the bonding of the oxidized surface to another surface is described. In this method a surface treatment having a pH in the range of 8-11 is applied to the oxidized surface, the surface treatment contains a base that becomes gaseous upon evaporation of the surface treatment, such as ammonium hydroxide ($NH_4OH$). The surface treatment is then evaporated from the oxidized surface and the oxidized surface is immediately bonded to a second substrate after evaporation of the surface treatment. The use of a base that becomes gaseous upon evaporation of the surface treatment allows for evaporation of the surface treatment from the oxidized surface without leaving residues. Additionally, the use of ammonium hydroxide in the surface treatment may terminate the oxidized surface with termination groups that promote easy bonding between two oxidized surfaces such as —OH, —$NH_4$, and —$O^-$.

DETAILED DESCRIPTION OF THE PRESENT INVENTION

Figure 1:
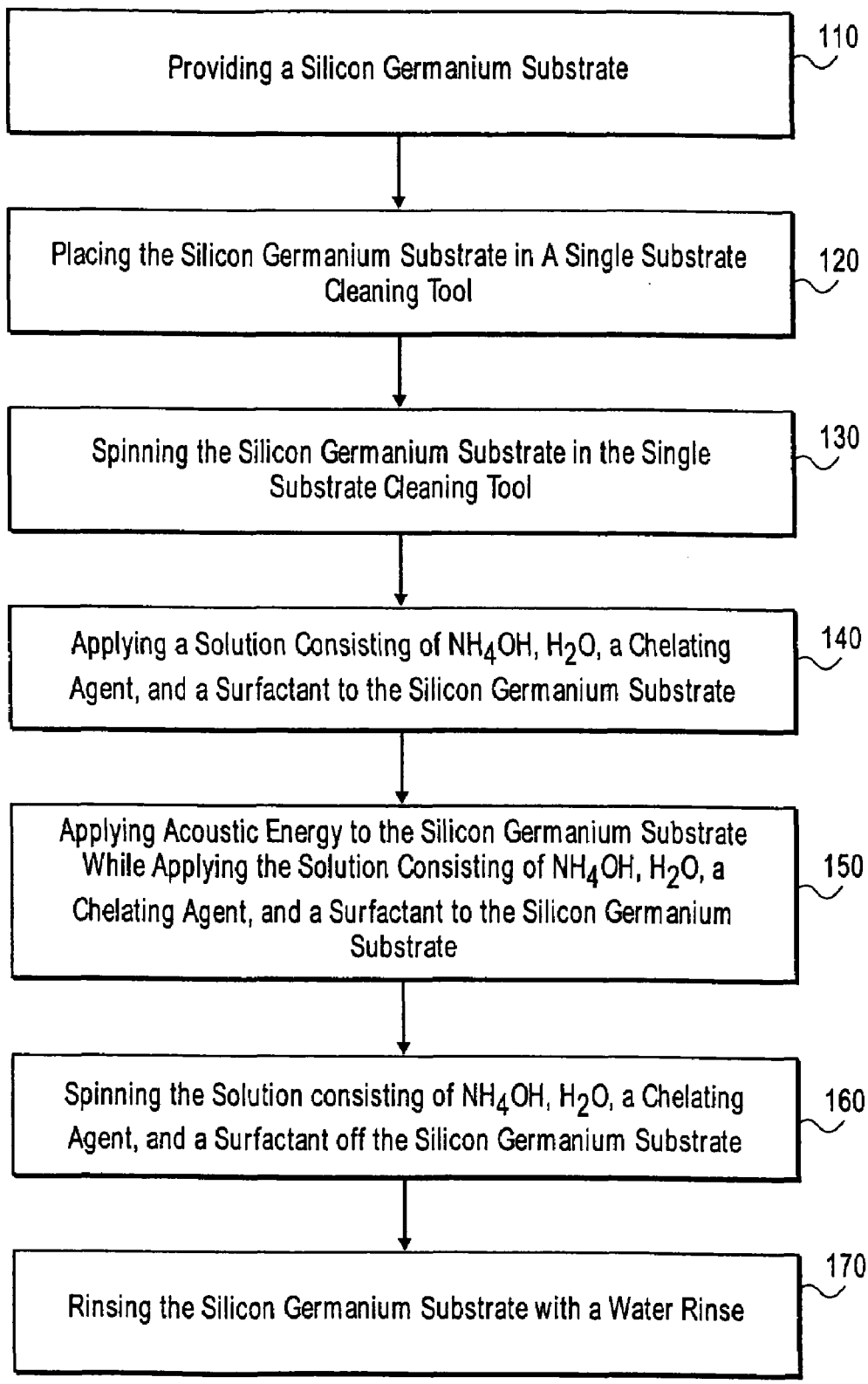
FIG. 1 is a flow-chart of an embodiment of cleaning a silicon germanium substrate with a cleaning solution of the current invention.

In the following description numerous specific details are set forth in order to provide a thorough understanding of the present invention. One of ordinary skill in the art will understand that these specific details are for illustrative purposes only and are not intended to limit the scope of the present invention. Additionally, in other instances, well-known processing techniques and equipment have not been set forth in particular detail in order to not unnecessarily obscure the present invention.

Embodiments of the current invention describe ammonia hydroxide treatments for surfaces used in semiconductor processing. In one embodiment, a method and a cleaning solution including ammonium hydroxide ($NH_4OH$), water ($H_2O$), a chelating agent, and a surfactant for cleaning silicon germanium substrates are described. The cleaning solution does not include hydrogen peroxide ($H_2O_2$) because hydrogen peroxide etches germanium. In another embodiment, a method of terminating oxidized surfaces on semiconductor substrates with terminating groups that promote the bonding of the oxidized surface to another surface with a surface treatment containing ammonium hydroxide ($NH_4OH$) is described. The oxidized surface is immediately bonded to a second substrate after evaporation of the surface treatment.

In one embodiment, a cleaning solution and a method for cleaning a silicon germanium substrate are described. This cleaning solution may effectively clean a silicon germanium substrate without unduly etching the germanium or silicon atoms and without causing excessive roughness of the surface of the substrate. The cleaning solution may contain ammonium hydroxide ($NH_4OH$), water ($H_2O$), a chelating agent, and a surfactant but it does not contain hydrogen peroxide ($H_2O_2$). The cleaning solution is formulated to prevent the etching of silicon by the ammonium hydroxide in the chemical solution. Also, the method for cleaning a silicon germanium substrate includes parameters to prevent the etching of silicon atoms within the silicon germanium substrates by the ammonium hydroxide in the chemical solution. These parameters include applying the chemical solution to the silicon germanium substrate for a short enough time to prevent etching of the silicon in the silicon germanium substrate and also applying the chemical solution at a temperature low enough to prevent etching of silicon atoms in the silicon germanium substrate.

A silicon germanium substrate may be formed by depositing a silicon germanium layer on a silicon wafer. After forming the silicon germanium layer, the silicon germanium substrate may be cleaned by providing a silicon germanium substrate at block 110 of FIG. 1 within a single substrate cleaning tool 200 as illustrated in FIG. 2 at block 120. The silicon germanium substrate may contain germanium in the approximate range of 15%-35% by weight, and more particularly the amount of germanium may be approximately 20% by weight or approximately 30% by weight. The amount of silicon in the silicon germanium substrate may be in the approximate range of 65% and 85% by weight and more particularly approximately 80% by weight or approximately 70% by weight. The silicon germanium substrate may be on a wafer 208. The wafer 208 is placed in the single wafer cleaning tool 200 and is clamped by a plurality of clamps 210. The wafer 208 may be rotated about its central axis to evenly distribute solutions dispensed onto the wafer 208 and also to spin-off solutions dispensed onto the wafer 208. At block 130 the silicon germanium wafer 208 is spinning at a spin rate in the approximate range of 5 rpm and 1000 rpm. While the wafer 208 is spinning, at block 140, a cleaning solution formed of ammonium hydroxide ($NH_4OH$) and water ($H_2O$) may be dispensed onto the top side of the wafer 208 from a nozzle 214 as a spray 220 or as a simple stream to form a layer 222 of the cleaning solution. The amount of ammonium hydroxide in the cleaning solution may be in the approximate range of 0.03% and 28% by weight. This silicon germanium cleaning solution does not include hydrogen peroxide ($H_2O_2$) because germanium is extremely sensitive to etching by hydrogen peroxide. The silicon atoms of the silicon germanium substrate are also sensitive to being etched by ammonium hydroxide, but the cleaning solution is formulated to prevent the etching of the silicon atoms by ammonium hydroxide. Additionally, the cleaning solution may be applied at a low temperature and for a short period of time to prevent the etching of the silicon atoms within the silicon germanium substrate. Therefore, ammonium hydroxide may be included in the cleaning solution without causing detrimental effects on the silicon germanium surface and the benefits of ammonia hydroxide may be taken advantage of in the cleaning solution. Ammonia hydroxide may be valuable because it is a base and bases are better at removing particles and residues than acidic solutions. The cleaning solution may have a pH in the approximate range of 8 and 11 and more particularly approximately 10. At these high pH values the negatively charged particles and residues may be repelled by the negatively charged silicon germanium substrate, thereby increasing the cleaning effectiveness of the cleaning solution.

The cleaning solution may be formulated to prevent the etching of the silicon atoms within the silicon germanium substrate by containing a surfactant that may protect the silicon atoms. The surfactant may coat the surface of the silicon germanium substrate and thus prevent the etching of the silicon atoms by the ammonium hydroxide. The surfactant may also improve the cleaning of the silicon germanium substrate by preventing the redeposition of impurities and particles onto the surface of the silicon germanium substrate. The surfactant may be a non-ionic surfactant because non-ionic surfactants are easier to remove from a wafer surface by a water rinse than other types of surfactants. The non-ionic surfactant may be Brij 78 produced by ICI Corporation. The amount of surfactant within the cleaning solution may be in the approximate range of 20 ppm and 500 ppm, and more particularly 40 ppm.

The cleaning solution may also contain a chelating agent to further increase the cleaning effectiveness of the cleaning solution by binding to metallic impurities such as iron, calcium, and zinc that may be present due to processing equipment. By increasing the cleaning effectiveness and efficiency, the amount of time necessary to clean the silicon germanium substrate may be decreased and the possibility of etching the silicon with the ammonium hydroxide may also be decreased. The amount of chelating agent in the cleaning solution may be in the approximate range of 20 ppm and 500 ppm, and more particularly 40 ppm.

The cleaning solution may be diluted by water at the point of use prior to dispensing the cleaning solution onto the silicon germanium substrate. The cleaning solution may be contained in a first holding tank 240 and deionized water for dilution may be stored in a second holding tank 250. The cleaning solution within the holding tank 240 may be a concentrated mixture of 28 weight % ammonium hydroxide. The concentrated cleaning solution within the holding tank 240 may also contain approximately 3000 ppm of a surfactant and 3000 ppm of a chelating agent. This concentrated cleaning solution may be diluted in the approximate range of 20 times to 100 times by the deionized water, or more particularly diluted approximately 40 times or approximately 80 times by deionized water. In one particular embodiment the concentrated cleaning solution in holding tank 240 is a mixture of 28% ammonium hydroxide, 3000 ppm surfactant, and 3000 ppm chelating agent in water. This concentrated cleaning solution is then diluted to 80 times its original concentration by the deionized water in holding tank 250 to approximately 0.365 weight % ammonium hydroxide, 400 ppm surfactant, and 400 ppm chelating agent. This dilution may occur at the point of use of the cleaning solution just prior to the application of the cleaning solution to the silicon germanium substrate. In an embodiment, the point of use dilution may occur within approximately 5 minutes and 10 minutes prior to use of the cleaning solution. In an alternate embodiment, the concentrated cleaning solution may be diluted up to 2 hours before use. A cleaning solution that is highly diluted may be valuable in preventing the etching of the silicon atoms in the silicon germanium substrate because there is less ammonium hydroxide present to etch the silicon atoms. After the point of use dilution of the cleaning solution, a cavitation gas 230 may be added into the cleaning solution by a venturi device 228. The cavitation gas may increase the effectiveness of the particle removal from the silicon germanium wafer 208 when acoustic energy is applied to the wafer 208, thus reducing the cleaning time. The cavitation gas may be hydrogen ($H_2$), argon (Ar) or oxygen ($O_2$).

The cleaning solution may be applied to the silicon germanium substrate at a temperature low enough to prevent etching of silicon atoms in the silicon germanium substrate. This temperature may be approximately less than 30° C., and more particularly in the approximate range of 20° C. and 22° C. (room temperature.) The temperature of the silicon germanium substrate and the ambient may also be at room temperature.

Figure 2:
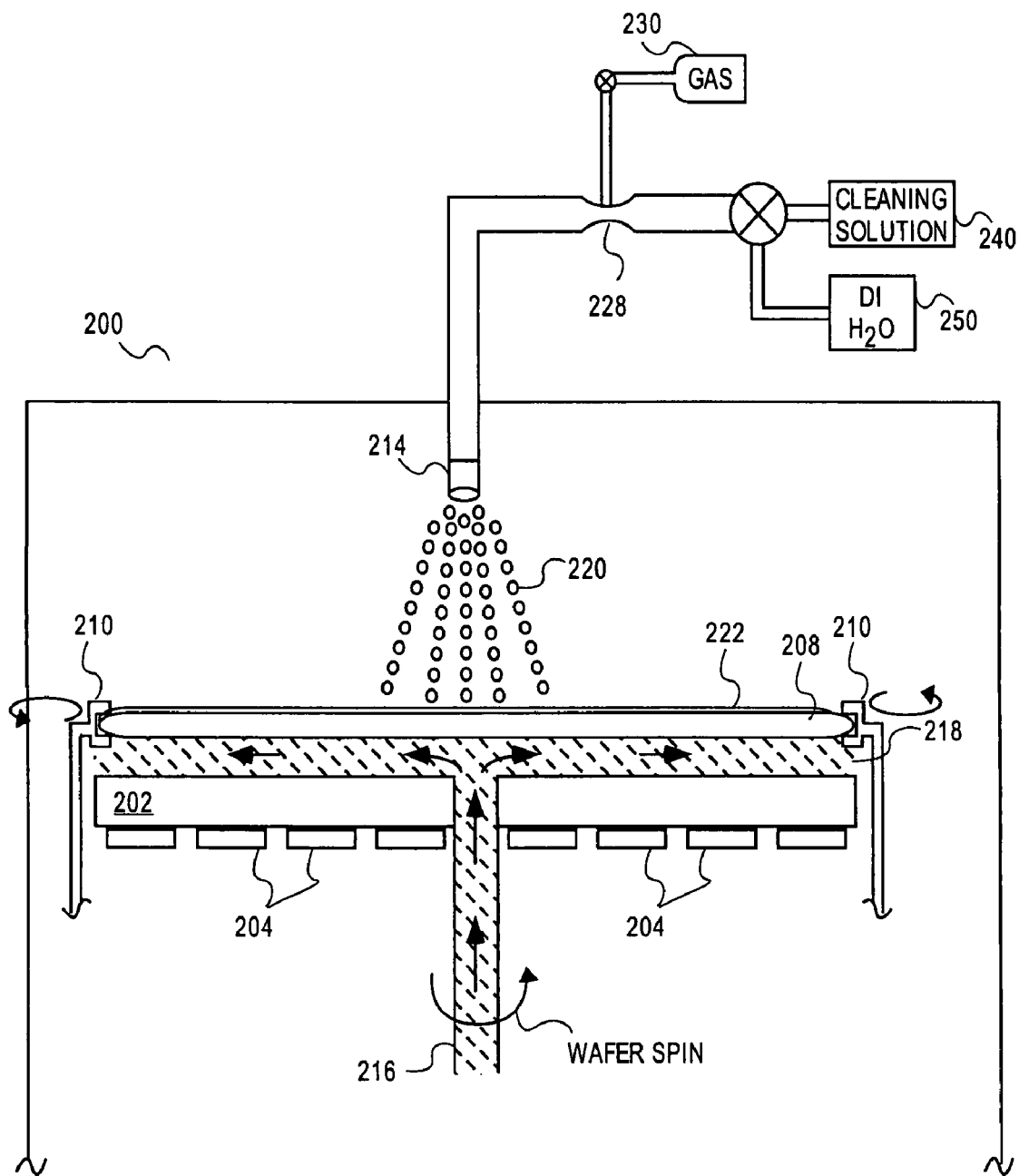
FIG. 2 is an illustration of a cross-sectional view of a single wafer cleaning tool.

At block 150 of FIG. 1, acoustic energy may be applied to the silicon germanium wafer 208 while the cleaning solution is on the silicon germanium wafer 208 within the single wafer cleaning apparatus 200. The silicon germanium wafer 208 may be held in a position above a plate 202 that may apply acoustic energy to the wafer though a liquid medium 218 that is flowed up through conduit 216. Plate 202 has several acoustic transducers 204 that may generate acoustic energy in the frequency range of 400 kHz and 8 MHz. The liquid medium 218 may be deionized water or it may be the cleaning solution to clean the backside of the silicon germanium wafer 208. The acoustic energy may have a frequency in the approximate range of 500 kHz and 4 MHz, and more particularly approximately 925 kHz. The application of acoustic energy to the silicon germanium wafer may increase the cleaning effectiveness and efficiency of the cleaning solution and therefore may decrease the cleaning time and thus the possibility of etching the silicon atoms in the silicon germanium wafer 208.

The cleaning solution may be applied to the silicon germanium substrate for a short enough time to prevent etching of the silicon atoms within the silicon germanium substrate. The cleaning solution may be applied to the silicon germanium substrate for a time in the approximate range of 10 seconds and 60 seconds, and more particularly for approximately 30 seconds. The flow of the cleaning solution is then stopped and the cleaning solution may then be removed from the silicon germanium wafer 208 at block 160 of FIG. 1 by spinning the cleaning solution off of the wafer at a spin rate of approximately 1000 rpm. The silicon germanium wafer may then be rinsed with a deionized water rinse at block 170 of FIG. 1 to ensure the complete removal of the cleaning solution containing ammonia hydroxide and any surfactant or chelating agent that may have been included in the cleaning solution.

A solution containing ammonium hydroxide may also be used as a surface treatment of oxidized surfaces. Such an ammonium hydroxide solution has a different composition than the ammonium hydroxide solution described above because of the different application of the solution. In contrast to the ammonium hydroxide solution described above, the ammonium hydroxide surface treatment for oxidized surfaces does not contain chelating agents or surfactants. Chelating agents and surfactants are left out of the solution to allow for the complete evaporation of the ammonium hydroxide solution without left over residues on the treated substrate. The oxidized surfaces treated with the ammonium hydroxide surface treatment are bonded to another surface immediately after application of the surface treatment. Therefore, the use of chelating agents or surfactants that may leave residues may detrimentally affect the bonding of the surfaces.

In this embodiment, the ammonia hydroxide solution may be used as part of a surface treatment for the oxidized surfaces of semiconductor substrates prior to the bonding of the oxidized surfaces. An ammonia hydroxide surface treatment may change the oxidized surface to bond the oxidized surface to another surface at low annealing temperatures. Termination groups that promote the bonding of an oxidized surface to another surface include hydroxide groups (—OH), ammonium groups (—$NH_4$), and negatively charged oxygen atoms (—$O^-$). The oxidized surface of a semiconductor substrate may be formed on a silicon substrate or another type of semiconductor material such as germanium or silicon germanium. The oxidized surface of a silicon substrate is a silicon dioxide surface. Silicon dioxide formed on a silicon substrate will be described as an exemplary embodiment.

Figure 3A:
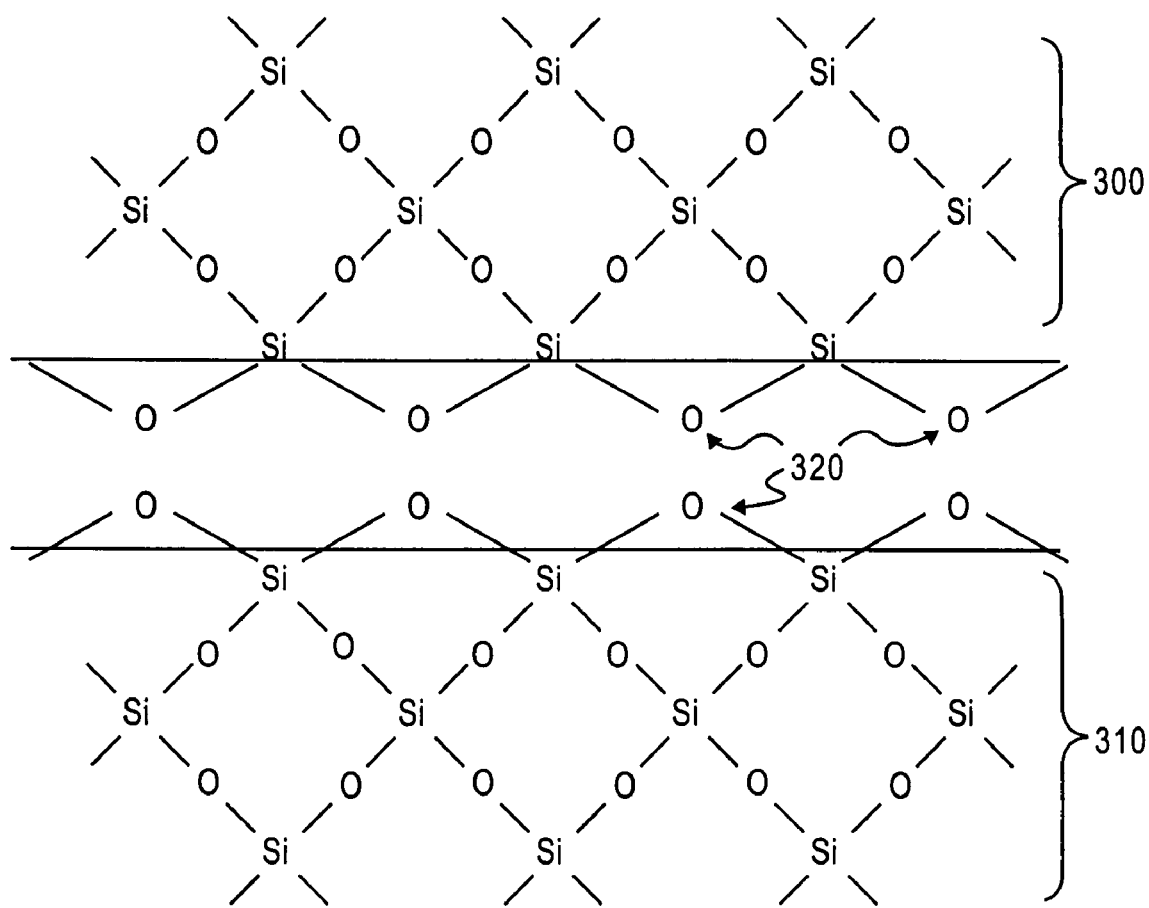
FIG. 3a is an illustration of a cross-sectional crystalline view of two silicon dioxide surfaces that are terminated by oxygen bridges.
Figure 3B:
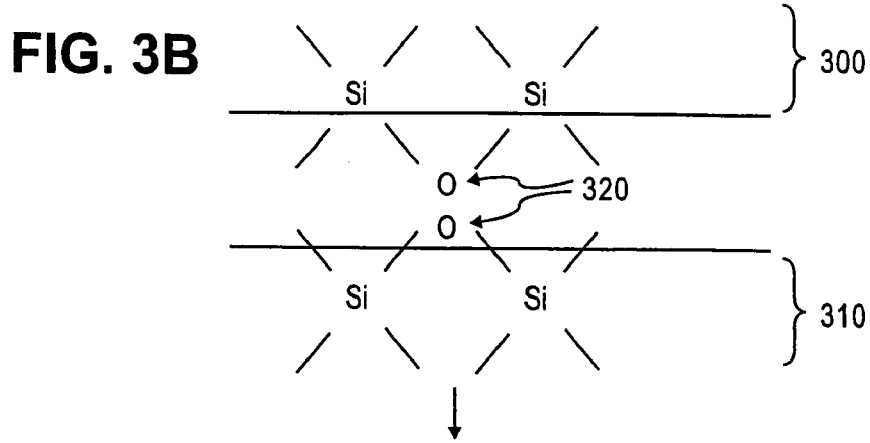
FIGS. 3b-3e illustrate a reaction sequence of forming covalent bonds between two silicon dioxide surfaces that are terminated by hydroxide groups.
Figure 3C:
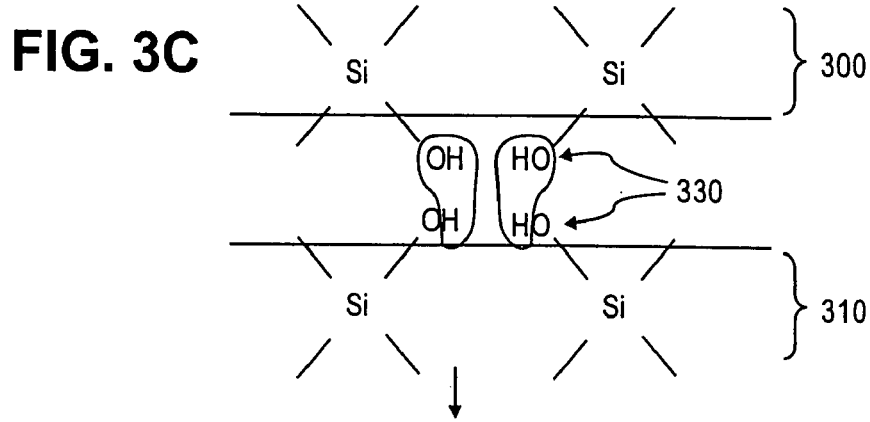
Figure 3D:
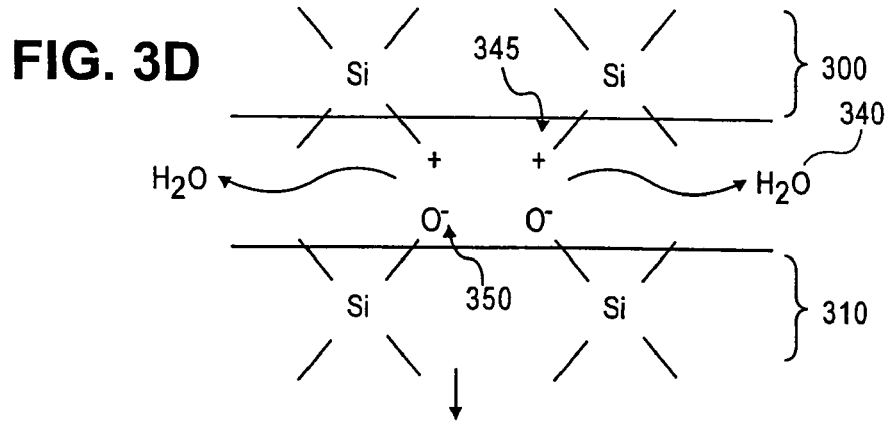
Figure 3E:
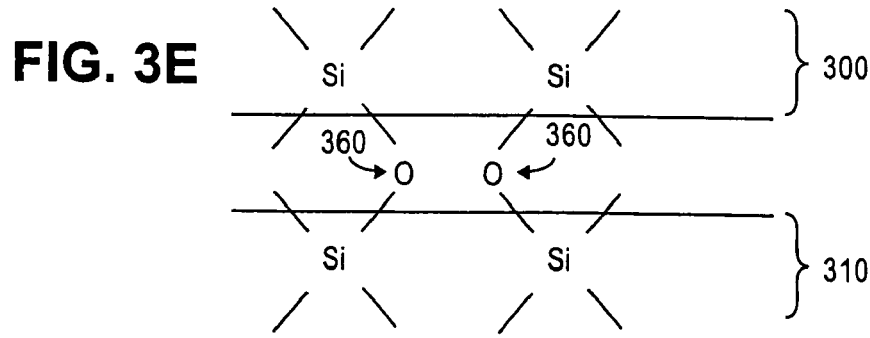

Two silicon dioxide surfaces that are each terminated by termination groups such as —OH, —$NH_4$, and —$O^-$, or a combination of these groups, may be bonded to one another through covalent chemical bonds by annealing the two surfaces. But, silicon dioxide surfaces on silicon substrates are typically terminated by oxygen bridges such as those illustrated in FIG. 3a due to the application of water rinses after cleaning. FIG. 3a illustrates two silicon dioxide surfaces 300 and 310, each terminated by oxygen bridges 320. The annealing temperature to form covalent chemical bonds between two silicon dioxide surfaces terminated by oxygen bridges is significantly higher than when the surface is terminated by the groups mentioned above and is typically between 1000° C. and 1100° C. These higher annealing temperatures are needed because the reaction sequence between two silicon dioxide surfaces terminated by oxygen bridges requires more steps to form covalent chemical bonds between the silicon dioxide surfaces than if the two silicon dioxide surfaces were each terminated by —OH, —$NH_4$, or —$O^-$ termination groups. The reaction sequence between two silicon dioxide surfaces terminated by oxygen bridges is illustrated in FIGS. 3b-3e. FIG. 3b illustrates two silicon dioxide surfaces 300 and 310, each having oxygen bridges 320. Upon heating, the oxygen bridges 320 break and form hydroxide (—OH) termination groups 330. The hydroxide (—OH) termination groups 330 react with one another to form water molecules 340, leaving positively charged silicon atoms 345 and negatively charged oxygen atoms 350 that react to form oxygen bonds 360 between the first silicon dioxide layer 300 and the second silicon dioxide layer 310. The number of steps in the reaction sequence may be reduced by initially terminating the silicon dioxide layers 300 and 310 with hydroxide groups (—OH) such as those illustrated at FIG. 3c, or by terminating the silicon dioxide layers 310 with negatively charged oxygen atoms (—$O^-$), such as those illustrated in FIG. 3d. A silicon dioxide layer such as 300 or 310 that is terminated by oxygen bridges 320 may be terminated with a combination of hydroxide groups (—OH), negatively charged oxygen atoms (—$O^-$), and ammonium groups (—$NH_4$) by applying an ammonium hydroxide surface treatment. Upon annealing, the two silicon dioxide surfaces, 300 and 310, bond to one another through oxygen bonds 360 between the two surfaces, as illustrated in FIG. 3e. These oxygen bonds 360 form easily due to the attraction between the positively charged silicon atoms 345 and the negatively charged oxygen atoms 350.

Figure 4A:
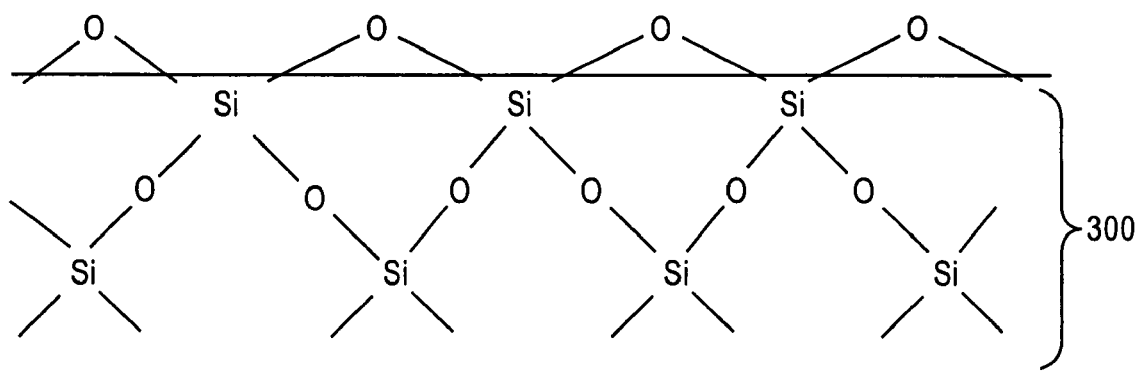
FIGS. 4a-4d illustrate terminating a silicon dioxide surface with termination groups that promote easy bonding between surfaces and the bonding of two surfaces having such termination groups.

The ammonium hydroxide surface treatment may be applied to an oxidized surface of a semiconductor substrate within a single wafer cleaning tool, such as the tool illustrated in FIG. 2. A wafer 208 having an oxidized surface such as a monocrystalline silicon wafer having a silicon dioxide surface 300 as illustrated in FIG. 4a may be placed in the single wafer cleaning tool 200 and held with the silicon dioxide surface 300 facing up by the plurality of clamps 210. The wafer 208 may be held at a distance of approximately 3 mm above the top surface of the plate 202. The silicon dioxide surface 300 of the silicon wafer 208 may first be cleaned to remove impurities before the ammonium hydroxide surface treatment is applied. The silicon dioxide surface 300 may be cleaned with a cleaning solution formed of a mixture of ammonium hydroxide ($NH_4OH$), hydrogen peroxide ($H_2O_2$), water ($H_2O$), and a chelating agent such as ethylenediaminediorthohydroxyphenylacetic acid (EDDHA). The cleaning solution may also optionally contain a surfactant. The cleaning solution is applied to the wafer 208 while the wafer 208 is spinning at a spin rate in the approximate range of 5 rpm and 1000 rpm. In an embodiment, deionized water is fed through a feed through channel 216 of plate 202 to provide a water filled gap 218 through which acoustic waves generated by transducers 204 can travel to wafer 208 while the wafer 208 is cleaned. After cleaning the surface of the wafer 208, the cleaning solution is removed by spinning the wafer at a spin rate of approximately 1000 rpm. The purpose of the cleaning is to remove impurities and particles from the silicon dioxide surface 300. The wafer 208 may be rinsed with a deionized water rinse after the cleaning step but before the ammonia hydroxide surface treatment. After cleaning the silicon dioxide surface 300 of the wafer 208, the surface may be predominantly terminated by oxygen bridges between the silicon atoms. A silicon dioxide surface 300 terminated by oxygen bridges is illustrated in FIG. 4a.

The silicon dioxide surface 300 of FIG. 4a of the wafer 208 is then treated with the surface treatment formed of a solution having a pH in the range of 8 and 11 and containing a base that becomes gaseous upon evaporation of the surface treatment. The surface treatment may be a solution of ammonium hydroxide and water. This solution is formed by dissolving gaseous ammonia ($NH_3$) into water ($H_2O$). The gaseous ammonia reacts with water to form liquid ammonium hydroxide ($NH_4OH$), as illustrated by the chemical equation below:

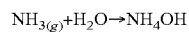

Upon evaporation, the ammonium hydroxide molecules ($NH_4OH$) dissociate into gaseous ammonia ($NH_3$) and water ($H_2O$), as illustrated by the chemical equation below:

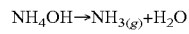

The surface treatment solution may contain approximately 1%-28% by weight ammonium hydroxide in deionized (DI) water, and more particularly approximately 10% by weight ammonium hydroxide in DI water. A sufficient amount of gaseous ammonia is dissolved into water to form these weight percentages of ammonium hydroxide. These ranges of ammonium hydroxide concentrations are chosen to terminate oxidized surfaces on semiconductor substrates with an amount of terminating groups sufficient to promote the bonding of the oxidized surface to another surface. A surface treatment having a pH in the approximate range of 8 and 11 may be valuable to terminate a larger number of atoms on the surface of the wafer 208 with negatively charged oxygen atoms. The higher the pH of the surface treatment, the greater the number of atoms on the surface of the wafer 208 that may be terminated by negatively charged oxygen atoms. But, an ammonium hydroxide solution having a pH of above 11 may etch the surface of wafer 208. It is valuable to terminate a larger number of atoms on the surface of the wafer 208 with negatively charged oxygen atoms because this type of termination easily bonds to other oxidized surfaces and will lower the annealing temperature necessary to bond the two surfaces to one another to below approximately 1000° C., and more particularly below approximately 700° C. The surface treatment may be applied to the silicon dioxide surface 300 having oxygen bridge termination of FIG. 4a within the single wafer cleaning tool 200. The surface treatment may be dispensed onto the silicon dioxide surface 300 through a nozzle 214 and may be in the form of a spray 220. The wafer 208 may be spinning at a spin rate in the approximate range of 200 rpm and 1000 rpm while the surface treatment is dispensed onto the silicon dioxide surface 300. The surface treatment may be applied to the surface of the wafer 208 for a time in the approximate range of 1 second and 10 seconds, and more particularly approximately 5 seconds. The surface treatment will spin off of the wafer after stopping the dispensation. The spin rate may be increased to spin off the surface treatment. Because the surface treatment is formed with a dissolved gaseous base, the surface treatment may completely evaporate from the surface without leaving behind any residues of the surface treatment.

Figure 4B:
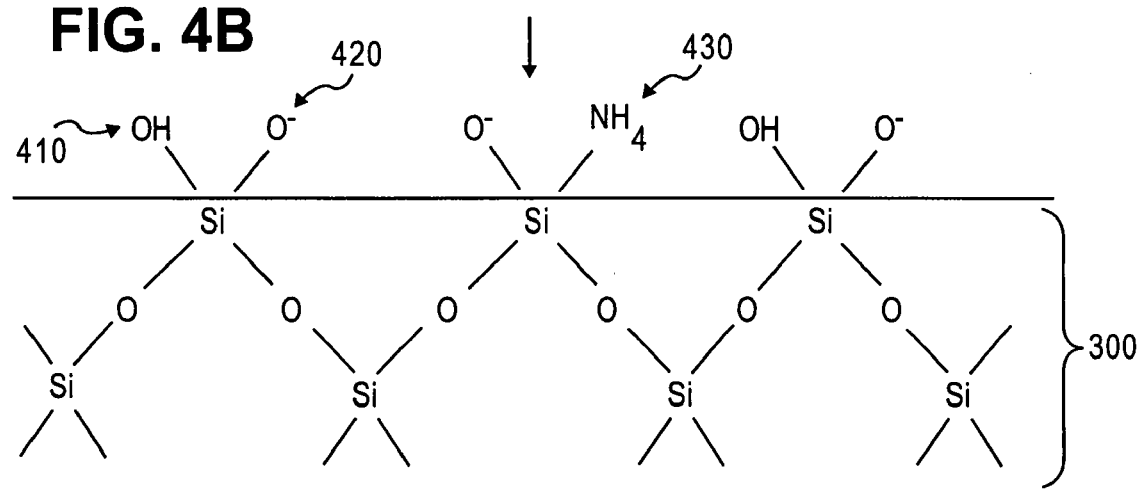

As illustrated in FIG. 4b the surface treatment may terminate the silicon dioxide surface 300 with a combination of hydroxide groups (—OH) 410, negatively charged oxygen atoms (—O$^-$) 420, and ammonium groups (—NH$_4$) 430. The silicon atoms of the silicon dioxide surface may be terminated with up to 100% hydroxide groups and negatively charged oxygen atoms and with up to 1% ammonium groups. The silicon dioxide surface 300 may retain a small percentage of oxygen bridges, but not enough to affect the annealing temperature at which the silicon dioxide surface may be bonded to another surface by annealing. The amount of the silicon dioxide surface 300 that is terminated by a combination of hydroxide groups (—OH) 410, negatively charged oxygen atoms (—O$^-$) 420, and ammonium groups (—NH$_4$) 430 is an amount sufficient to lower the annealing temperature at which the oxidized surface, and in this instance the silicon dioxide surface, may be bonded to another surface to below approximately 1000° C., and more particularly below approximately 700° C. After the surface treatment has evaporated from the silicon dioxide surface 300, the wafer 208 is removed from the single wafer cleaning tool 200.

The silicon dioxide surface 300 may be bonded to another surface immediately after the surface treatment is evaporated from the silicon dioxide surface 300 of the silicon wafer 208. The silicon dioxide surface 300 that has been terminated with a combination of hydroxide groups (—OH) 410, negatively charged oxygen atoms (—O$^-$) 420, and ammonium groups (—NH$_4$) 430 is not rinsed after removing the surface treatment to maintain the termination groups that promote the bonding of the silicon dioxide surface 300 to another surface. If a water rinse were applied to the silicon dioxide surface 300 after the surface treatment, the surface termination would revert to being mainly oxygen bridges. In order to retain the surface termination present after applying the surface treatment, the gaseous base is valuable because it may evaporate without leaving any residues and thus does not require a subsequent water rinse to remove residues.

Figure 4C:
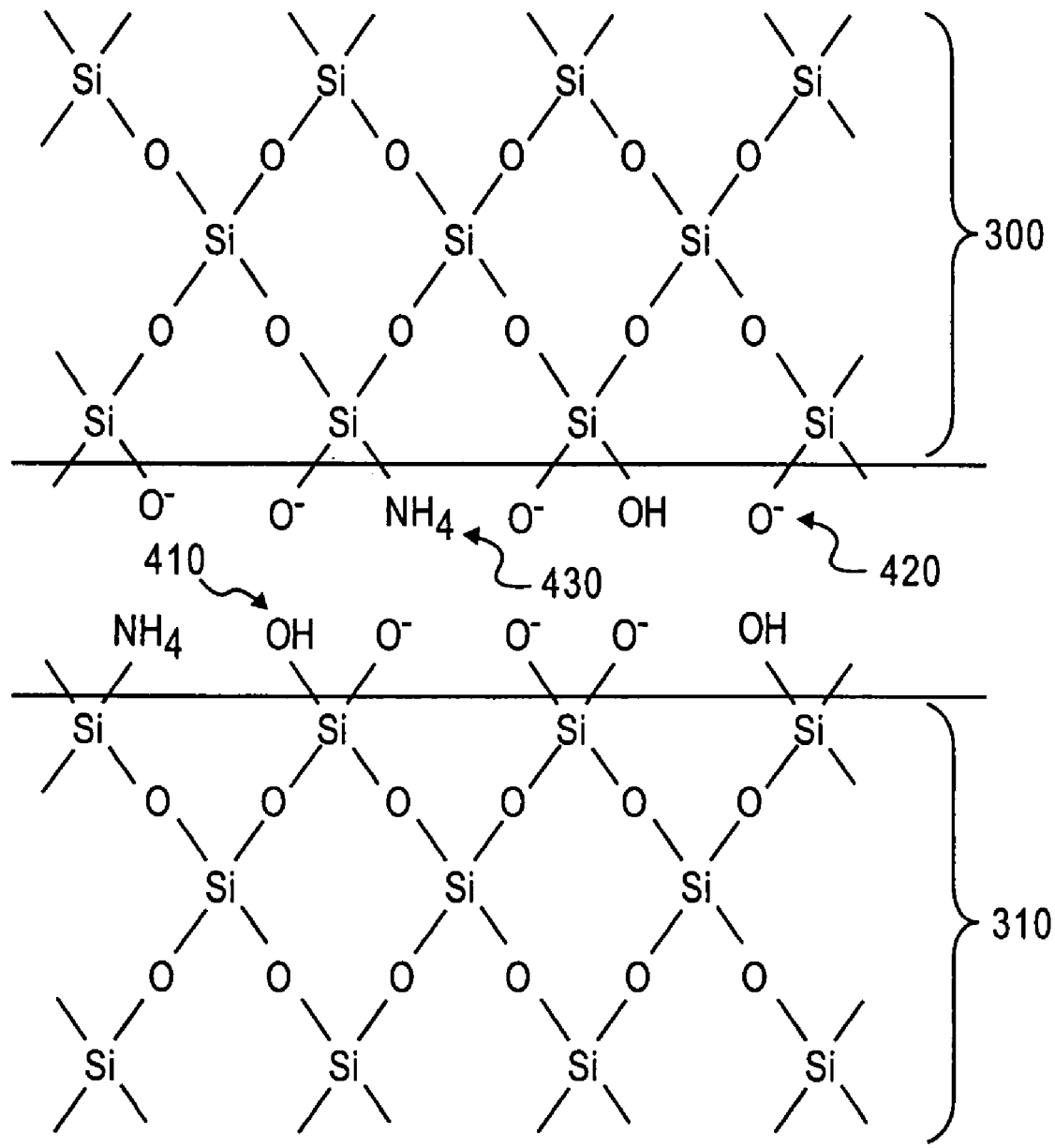
Figure 4D:
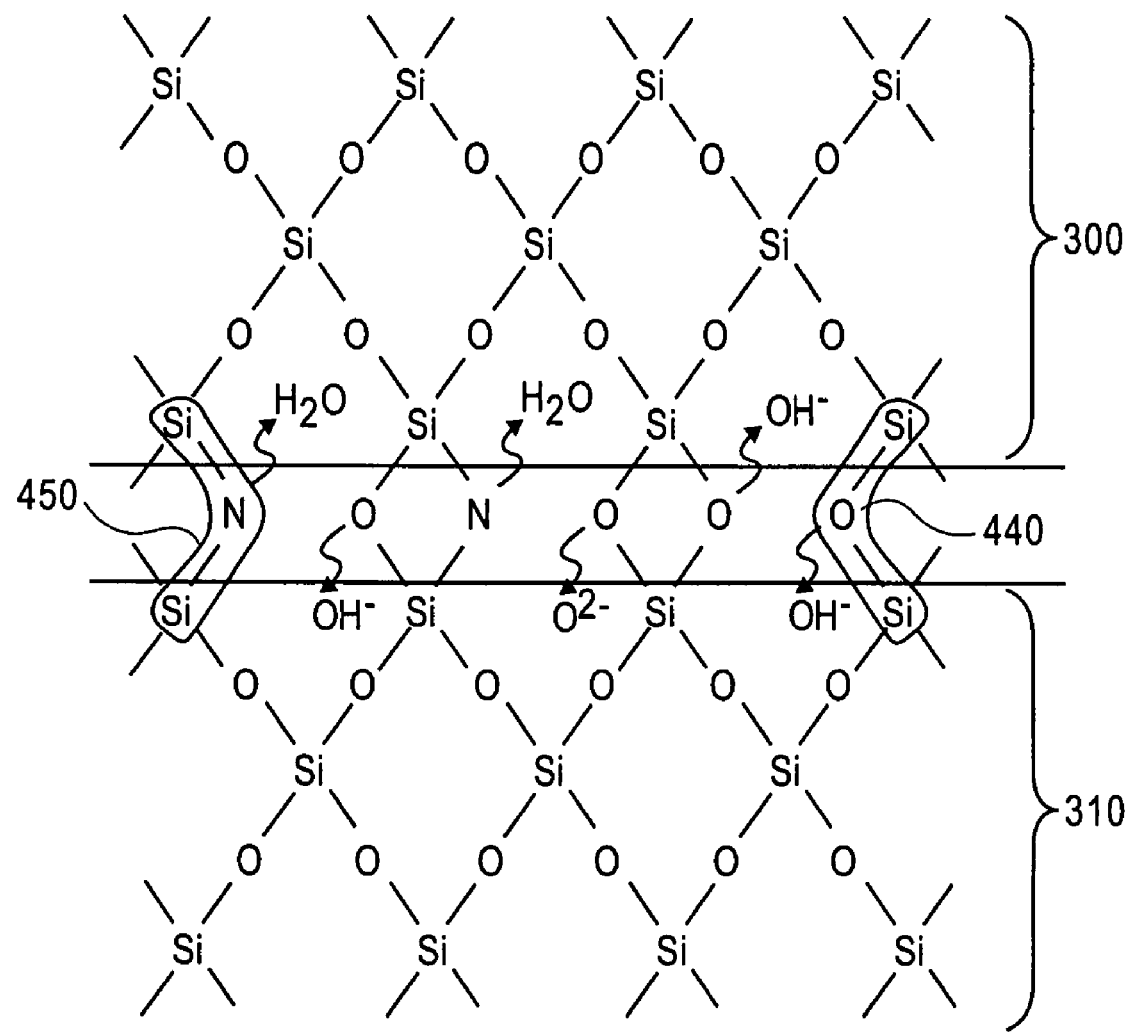

In one embodiment, the silicon dioxide surface 300 that has been terminated with a combination of hydroxide groups (—OH) 410, negatively charged oxygen atoms (—O$^-$) 420, and ammonium groups (—NH$_4$) 430 may be bonded to another silicon dioxide surface 310 that has similar termination groups, as illustrated in FIG. 4c. The two surfaces are first aligned with one another and will stick to one another by Van der Waals forces. The two surfaces that are now in contact with one another may now be placed into an annealing chamber to create covalent bonds between the two surfaces. The substrates may be heated to a temperature sufficient to form covalent bonds such as the Si—O—Si bonds 440 and the Si—N—Si bonds 450, as illustrated in FIG. 4d. The covalent bonds may be formed by a reaction that forms the covalent bond and a byproduct such as water, hydroxide, or oxygen ions. The bonded substrate in FIG. 4d may be used to form a silicon-on-insulator substrate through the bond and split method. In this method a first monocrystalline silicon wafer has a thin silicon dioxide layer grown on its surface that will later serve as a buried oxide in an SOI substrate. This first wafer is then flipped over and bonded to the silicon dioxide surface of a second monocrystalline silicon wafer in which a high stress zone has been formed by the implantation of a high dose of ions. The first wafer is then cleaved along the high stress zone, resulting in an SOI substrate. Oxidized surfaces may be bound to other surfaces to form structures such as microelectronic machines (MEM's.)

It is to be appreciated that the disclosed specific embodiments are only meant to be illustrative of the present invention and one of ordinary skill in the art will appreciate the ability to substitute features or to eliminate disclosed features. As such, the scope of the Applicant's invention is to be measured by the appended claims that follow.

We claim:
1. An H$_2$O$_2$-free solution, consisting of:
NH$_4$OH;
H$_2$O;
a chelating agent;
a cavitation gas;
a surfactant; and
products resulting from combining the solution.
2. The H$_2$O$_2$-free solution of claim 1, wherein NH$_4$OH is in an approximate range of 0.03% by weight and 28% by weight of the solution.
3. The H$_2$O$_2$-free solution of claim 1, wherein NH$_4$OH is 0.725% by weight of the solution.
4. The H$_2$O$_2$-free solution of claim 1, wherein the chelating agent is EDDHA.
5. The H$_2$O$_2$-free solution of claim 1, wherein the chelating agent is in an approximate range of 20 ppm and 500 ppm of the solution.
6. The H$_2$O$_2$-free solution of claim 1, wherein the chelating agent is approximately 40 ppm of the solution.
7. The H$_2$O$_2$-free solution of claim 1, wherein the surfactant is a non-ionic surfactant.
8. The H$_2$O$_2$-free solution of claim 1, wherein the surfactant is in an approximate range of 20 ppm and 500 ppm of the solution.
9. The H$_2$O$_2$-free solution of claim 1, wherein the surfactant is approximately 40 ppm of the solution.
10. The H$_2$O$_2$-free solution of claim 1, wherein the pH of the solution is in the approximate range of 8 and 11.
11. The H$_2$O$_2$-free solution of claim 1, wherein the pH of the solution is approximately 10.
12. The H$_2$O$_2$-free solution of claim 1, wherein the cavitation gas is selected from the group consisting of hydrogen, argon, and oxygen.

* * * * *